United States Patent
Chang et al.

(10) Patent No.: US 9,754,637 B2
(45) Date of Patent: Sep. 5, 2017

(54) ERASING METHOD AND MEMORY DEVICE USING THE SAME

(71) Applicant: MACRONIX INTERNATIONAL CO., LTD., Hsinchu (TW)

(72) Inventors: Yu-Ming Chang, Pingtung County (TW); Hsiang-Pang Li, Zhubei (TW); Hsin-Yu Chang, Kaohsiung (TW); Chien-Chung Ho, Taichung (TW); Yuan-Hao Chang, Taipei (TW)

(73) Assignee: MACRONIX INTERNATIONAL CO., LTD., Hsinchu (TW)

( * ) Notice: Subject to any disclaimer, the term of this patent is extended or adjusted under 35 U.S.C. 154(b) by 0 days.

(21) Appl. No.: 15/212,340

(22) Filed: Jul. 18, 2016

(65) Prior Publication Data
US 2017/0148493 A1    May 25, 2017

Related U.S. Application Data

(60) Provisional application No. 62/259,658, filed on Nov. 25, 2015.

(51) Int. Cl.
| | |
|---|---|
| *G11C 7/00* | (2006.01) |
| *G11C 16/00* | (2006.01) |
| *G11C 16/16* | (2006.01) |
| *G11C 16/14* | (2006.01) |

(52) U.S. Cl.
CPC .............. *G11C 7/00* (2013.01); *G11C 16/14* (2013.01); *G11C 16/16* (2013.01)

(58) Field of Classification Search
CPC ............ G11C 7/00; G11C 16/14; G11C 16/16
USPC ...... 365/218, 185.02, 185.09, 185.11, 185.29
See application file for complete search history.

(56) References Cited

U.S. PATENT DOCUMENTS

| | | | | |
|---|---|---|---|---|
| 6,172,906 | B1* | 1/2001 | Estakhri | .................... 365/185.11 |
| 2005/0141284 | A1* | 6/2005 | Futatsuyama | .......... G11C 16/16 365/185.29 |
| 2013/0229872 | A1* | 9/2013 | Kim | .................... G11C 11/5635 365/185.11 |

* cited by examiner

*Primary Examiner* — Tan T. Nguyen
(74) *Attorney, Agent, or Firm* — McClure, Qualey & Rodack, LLP

(57) ABSTRACT

An erasing method and a memory device are provided. The memory device includes a plurality of memory blocks. Each of the memory blocks has n sub-blocks. The erasing method includes the following steps. A first erase region is selected from a first memory block of the memory blocks, and the first erase region includes at least one sub-block. A sub-block erase operation is performed on the first erase region of the first memory block.

18 Claims, 7 Drawing Sheets

| 1 | V(80,48) | R1
| 2 | V(90,38) |
| 3 | I(40,88) |
| 4 | I(50,78) |
| 5 | I(20,108) |
| 6 | V(70,58) |
| 7 | I(30,98) |
| 8 | V(120,8) |

FIG. 5A

| 1 | V(80,48) |
| 2 | V(90,38) | R3
| 3 | I(40,88) | R2
| 4 | I(50,78) |
| 5 | I(20,108) |
| 6 | V(70,58) |
| 7 | I(30,98) |
| 8 | V(120,8) |

FIG. 5B

| 1 | V(80,48) |
| 2 | V(90,38) |
| 3 | I(40,88) |
| 4 | I(50,78) |
| 5 | I(20,108) |
| 6 | V(70,58) |
| 7 | I(30,98) |
| 8 | V(120,8) |

FIG. 5C

| 1 | V(80,48) |
| 2 | V(90,38) |
| 3 | I(40,88) | R4
| 4 | I(50,78) |
| 5 | I(20,108) |
| 6 | V(70,58) |
| 7 | I(30,98) |
| 8 | V(120,8) |

FIG. 5D

| 1 | V(80,48) |
| 2 | V(90,38) |
| 3 | I(40,88) |
| 4 | I(50,78) |
| 5 | I(20,108) | E3
| 6 | V(70,58) |
| 7 | I(30,98) |
| 8 | V(120,8) |

FIG. 5E

| 1 | V(80,48) | ┌R1'
|---|---|
| 2 | V(90,38) |
| 3 | I(40,88) |
| 4 | I(50,78) |
| 5 | I(20,108) |
| 6 | V(70,58) |
| 7 | I(30,98) |
| 8 | V(120,8) |

FIG. 6A

| 1 | V(80,48) | ┌R2'
|---|---|
| 2 | V(90,38) |
| 3 | I(40,88) |
| 4 | I(50,78) |
| 5 | I(20,108) |
| 6 | V(70,58) |
| 7 | I(30,98) |
| 8 | V(120,8) |

FIG. 6B

| 1 | V(80,48) | ┌R3'
|---|---|
| 2 | V(90,38) |
| 3 | I(40,88) |
| 4 | I(50,78) |
| 5 | I(20,108) |
| 6 | V(70,58) |
| 7 | I(30,98) |
| 8 | V(120,8) |

FIG. 6C

| 1 | V(80,48) | ┌E4
|---|---|
| 2 | V(90,38) |
| 3 | I(40,88) |
| 4 | I(50,78) |
| 5 | I(20,108) |
| 6 | V(70,58) |
| 7 | I(30,98) |
| 8 | V(120,8) |

FIG. 6D

ERASING METHOD AND MEMORY DEVICE USING THE SAME

This application claims the benefit of U.S. Provisional application Ser. No. 62/259,658, filed Nov. 25, 2015, the disclosure of which is incorporated by reference herein in its entirety.

BACKGROUND

Technical Field

The disclosure relates in general to an erasing method and a memory device using the same.

Description of the Related Art

When performing an erase operation on the memory device, normally the erase operation is performed in a unit of a whole memory block. However, when the whole block is being erased, the data stored in all valid pages of the whole memory block needs to be copied and then moved to the other memory block. Therefore, it is not efficient for performing an erase operation on a whole memory block. A way of a sub-block erase operation is to apply an erase voltage for erasing a sub-block. However, the erase voltage may influence the sub-block adjacent to the region to be erased, and cause the data stored in the sub-block adjacent to the region to be erased damaged. Thus, a new sub-block erasing method is needed.

SUMMARY

The disclosure is directed to an erasing method and a memory device using the same.

According to the disclosure, an erasing method for a memory device is provided. The memory device includes a plurality of memory blocks. Each of the memory blocks has n sub-blocks. The erasing method includes the following steps. A first erase region is selected from a first memory block of the memory blocks, and the first erase region includes at least one sub-block. A sub-block erase operation is performed on the first erase region of the first memory block.

According to the disclosure, a memory device using the erasing method is provided. The memory device includes a memory array and an erase controller. The memory array includes a plurality of memory blocks, and each of the memory blocks has n sub-blocks. The erase controller is electrically connected to the memory array. The erase controller is configured to select a first erase region from a first memory block of the memory blocks, and the first erase region includes at least one sub-block. And the erase controller is further configured to perform a sub-block erase operation on the first erase region of the first memory block.

The above and other aspects of the invention will become better understood with regard to the following detailed description of the preferred but non-limiting embodiment(s). The following description is made with reference to the accompanying drawings.

BRIEF DESCRIPTION OF THE DRAWINGS

FIGS. 5A-5E shows diagrams of an example of searching the highest value of recycle benefit index and determining the first erase region.

FIGS. 6A-6D shows diagrams of an example of searching the highest value of recycle benefit index and determining the first erase region.

DETAILED DESCRIPTION

Figure 1:
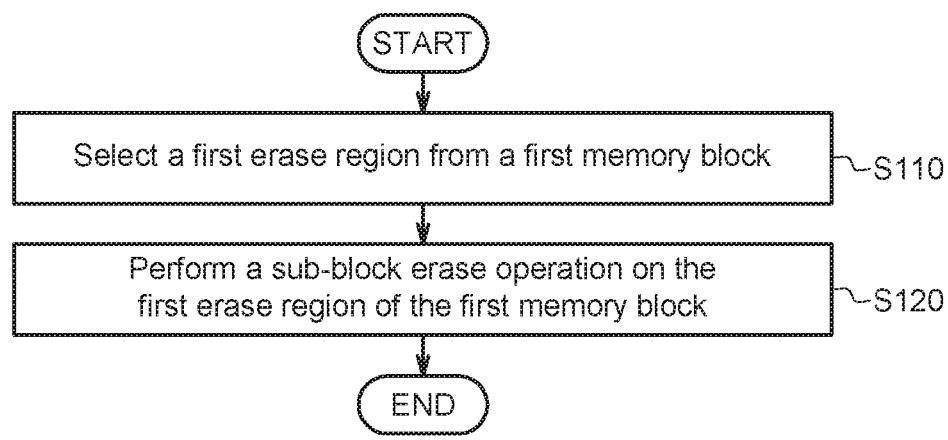
FIG. 1 shows a flow chart of an erasing method for a memory device according to the first embodiment of the present disclosure.

In the present disclosure, a memory device and an erasing method are provided. Several embodiments are provided hereinafter with reference to the accompanying drawings for describing the related configurations and procedures. However, the present disclosure is not limited thereto. The identical and/or similar elements of the embodiments are designated with the same or similar reference numerals.

Figure 2:
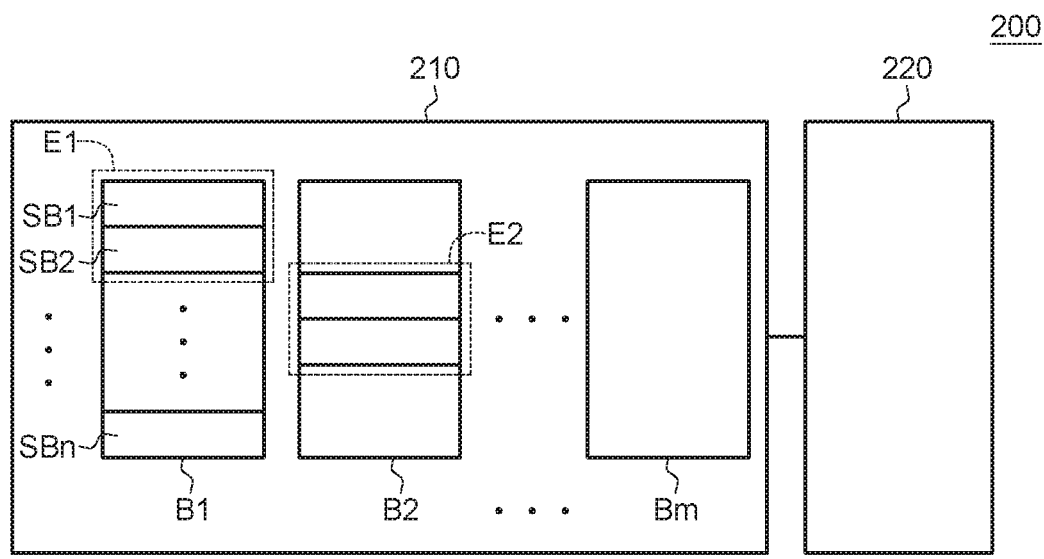
FIG. 2 shows a block diagram of a memory device according to the first embodiment of the present disclosure.

Please refer to FIG. 1 and FIG. 2. FIG. 2 shows a block diagram of a memory device according to the first embodiment of the present disclosure. The memory device 200 includes a memory array 210 and an erase controller 220. The memory array 210 includes a plurality of memory blocks B1-Bm, and each of the memory blocks has n sub-blocks SB1-SBn. The erase controller 220 is electrically connected to the memory array 210, and the erase controller 220 controls the erase operation of the memory array 210. For, example, the erase controller 220 selects the erase region E1 or the erase region E2 for performing the sub-block erase operation.

FIG. 1 shows a flow chart of an erasing method for a memory device according to the first embodiment of the present disclosure. The erasing method includes the following steps. Firstly, in step S110, a first erase region is selected by the erase controller 220 from a first memory block B1 of the memory blocks B1-Bm, and the first erase region E1 includes at least one sub-block. And then in step S120, a sub-block erase operation is performed on the first erase region E1 of the first memory block B1. And the erasing method stops.

Figure 3:
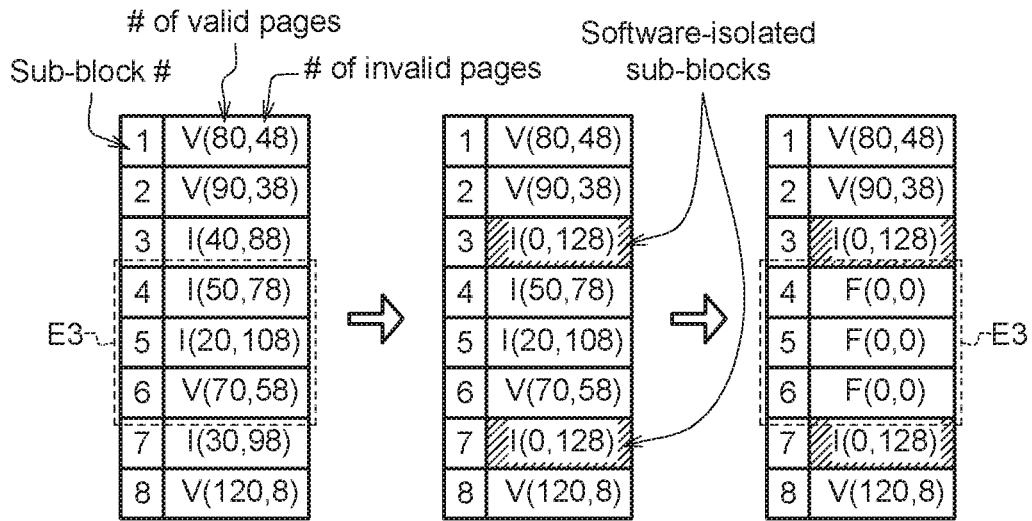
FIG. 3 shows a diagram of an example of selecting a first erase region from the first memory block.

Specifically, FIG. 3 shows a diagram of an example of selecting a first erase region from the first memory block. In this example, the first erase region B1 is divided into 8 sub-blocks. However, the present disclosure is not limited thereto. And each of the sub-blocks has a plurality of pages, and each of the pages is a valid page or an invalid page. As shown in FIG. 3, each of the sub-blocks is marked with a number of the valid pages of each of the sub-blocks, and a number of the invalid pages of each of the sub-blocks. If the number of the valid pages of each of the sub-blocks is greater than the number of the invalid pages of each of the sub-blocks, the sub-block is marked as V. If the number of the valid pages of each of the sub-blocks is smaller than the number of the invalid pages of each of the sub-blocks, the sub-block is marked as I. In this example, the sub-block 4~6 is selected as the erase region E. And when performing the sub-block erase operation, the sub-blocks adjacent to the erase region E3, i.e. sub-blocks 3 and 7 may be affected and causing the stored data be damaged and become invalid data. As shown in FIG. 3, the invalid pages in the sub-blocks 3 and 7 changes to 128. Therefore, the sub-blocks 3 and 7 are determined as the software-isolated sub-blocks in the present disclosure, and the data of the valid pages in the sub-blocks 3 and 7 needs to be moved. As shown in FIG. 3, after performing the sub-block erase operation on the sub-blocks 4-6, the valid pages in the sub-blocks 4-6 and the invalid pages in the sub-blocks 4-6 are both 0, and thus is marked as F.

In the present disclosure, the hardware structure of the software-isolated sub-block is the same as or similar to the hardware structure of other sub-blocks. And the data of the valid pages in the software-isolated sub-blocks is moved to the other memory block so that the remaining data in the sub-blocks is not affected and damaged by the adjacent erase operation. Therefore, in the present disclosure, the sub-block erase operation can be performed without using a hardware-isolated layer. In addition, the sub-blocks to be erased may be selected optionally, and the sub-block adjacent to the sub-blocks to be erased is selected as the software-isolated sub-block and therefore the data of the valid pages in the software-isolated sub-block is moved to other memory blocks. For instance, sub-blocks 1, 3, 5, 7 are selected as the software-isolated sub-blocs and the sub-block erase operation is performed on the sub-blocks 2, 4, 6, 8. In another embodiment, a full-block erase operation is performed on the whole memory block after the sub-block erase operation is performed. And after all data of all sub-blocks in the whole memory block is erased, a read operation, a write operation, or other operations may be performed on the software-isolated sub-block.

Figure 4:
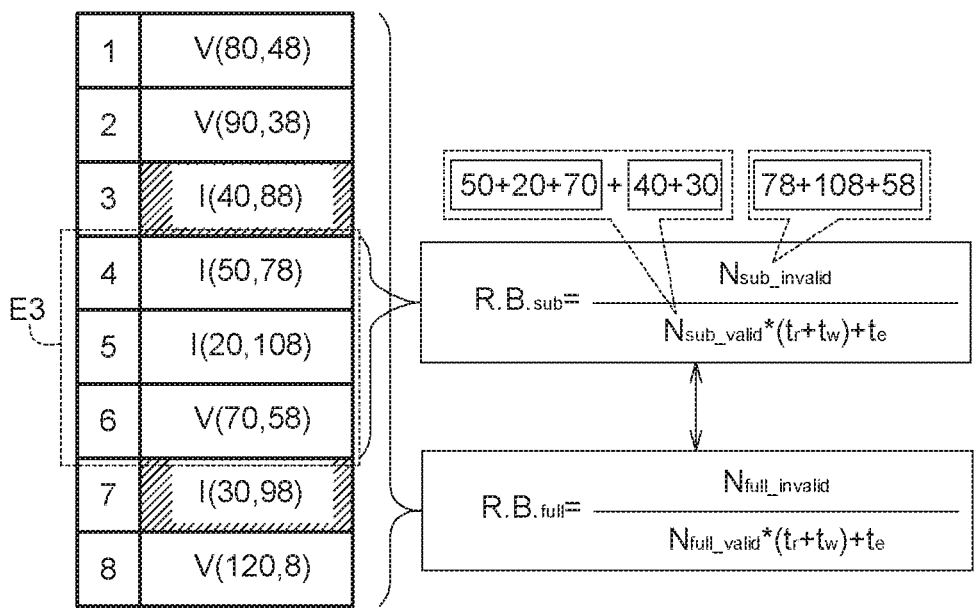
FIG. 4 shows a diagram of an example of calculating the recycle benefit index.

In the present disclosure, the erase region is selected according to the number of the valid pages in the sub-blocks of the erase region, the number of the valid pages in the sub-block adjacent to the erase region, and the number of the invalid pages in the sub-blocks of the erase region. Thus, in an embodiment, a recycle benefit index is defined to select the erase region for reducing the copy overhead of valid page data in the erase region, and reducing the copy overhead of the valid page data in the sub-block adjacent to the erase region. FIG. 4 shows a diagram of an example of calculating the recycle benefit index. In this example, the recycle benefit index $$R.B._{sub} = \frac{N_{sub\_invalid}}{N_{sub\_valid} * (t_r + t_w) + t_e},$$

where $R.B._{sub}$ is the recycle benefit index corresponding to the erase region, $N_{sub\_invalid}$ is the number of the invalid pages in the sub-blocks of the erase region, i.e. a sum of the number of the invalid pages in the sub-blocks 4-6 of the erase region E3 (78+108+58). $N_{sub\_valid}$ is a sum of the number of the valid pages in the sub-blocks of the erase region and the number of the valid pages in the sub-block adjacent to the erase region, i.e. a sum of the number of the invalid pages in the sub-blocks 4-6 of the erase region E3 and the number of the invalid pages in the software-isolated sub-blocks 3 and 7 (50+20+70+40+30). $t_r$ is a time to read a page. $t_w$ is a time to write a page. $t_e$ is a time to erase an erase region. And according to the formula of the recycle benefit index, the numerator represents the new space obtained by erasing the sub-block, and the denominator is a product of the number of the invalid pages to be moved and a time of the read operation and the write operation, and plus a time of the erase operation, representing the cost of moving valid page data. Therefore, the greater value of the recycle benefit index is, the more free space is obtained by erasing the region and the fewer cost of moving data is needed. And thus the region having greater value of the recycle benefit index is determined as the erase region in the present disclosure. In an embodiment, the recycle benefit index $R.B._{full}$ corresponding to the whole memory block is calculated according to the formula, $$R.B._{full} = \frac{N_{full\_invalid}}{N_{full\_valid} * (t_r + t_w) + t_e},$$

where $N_{full\_invalid}$ is the number of the invalid pages in all sub-blocks of the whole memory block, i.e. a sum of the number of the invalid pages in the sub-blocks 1-8. $N_{full\_valid}$ is a sum of the number of the valid pages in all sub-blocks of the whole memory block, i.e. a sum of the number of the valid pages in the sub-blocks 1-8. And if the recycle benefit index $R.B._{full}$ corresponding to the whole memory block is greater than the recycle benefit index $R.B._{sub}$ corresponding to the erase region, a full-block erase operation is performed on the whole memory block.

FIGS. 5A-5E shows diagrams of an example of searching the highest value of recycle benefit index and determining the first erase region. In this example, the recycle benefit index of the erase region having one sub-block is calculated firstly, that is, calculating the recycle benefit index of the erase region R1 having sub-block 1, the erase region R2 having sub-block 2, . . . , until the erase region (not shown) having sub-block 8. Afterwards, the recycle benefit index of the erase region having 2 sub-blocks is calculated, that is, calculating the recycle benefit index of the erase region R3 having sub-blocks 1 and 2, the erase region R4 having sub-blocks 2 and 3, . . . , until the erase region (not shown) having sub-blocks 7 and 8. And the recycle benefit index is calculated continually until the erase region having all of the 8 sub-blocks is calculated. After all of the recycle benefit index are calculated, the region having a highest value of recycle benefit index is selected from all of the regions as the erase region. For example, in this embodiment, the recycle benefit index having the highest value of 1.1536 which is greater than the recycle benefit index corresponding to the whole memory block (1.0448), and therefore the corresponding region E3 is determined as the erase region. In this embodiment, the recycle benefit index of the combinations of all sub-blocks is calculated so that the determined erase region has the highest efficiency.

FIGS. 6A-6D shows diagrams of an example of searching the highest value of recycle benefit index and determining the first erase region. In this example, the recycle benefit index of the erase region having one sub-block is calculated firstly, that is, calculating the recycle benefit index of the erase region R1' having sub-block 1, and then the recycle benefit index of the erase region having 2 sub-blocks is calculated, that is, calculating the recycle benefit index of the erase region R2' having sub-blocks 1 and 2, and then the recycle benefit index of the erase region having 3 sub-blocks is calculated, that is, calculating the recycle benefit index of the erase region R3' having sub-blocks 1-3. And the recycle benefit index is calculated continually until the erase region having all of the 8 sub-blocks is calculated. Afterwards, the region having the highest value of recycle benefit index is selected from all of the regions as the erase region. For example, in this embodiment, the recycle benefit index having the highest value of 1.0897 which is greater than the recycle benefit index corresponding to the whole memory block (1.0448), and therefore the corresponding region E4 is determined as the erase region. In this embodiment, although the recycle benefit index of the erase region E4 (1.0957) is smaller than the recycle benefit index of the erase region E3 as shown in FIG. 5E (1.1536). However, in this embodiment, the recycle benefit index is calculated 8 times, and therefore the calculation time is reduced significantly as compared to the embodiment in the FIGS. 5A-5E. Moreover, since all of the erase regions include the first sub-block 1, that is, the sub-block erase operation is performed from the beginning, the sub-block erase may be performed evenly on all sub-blocks.

Figure 7:
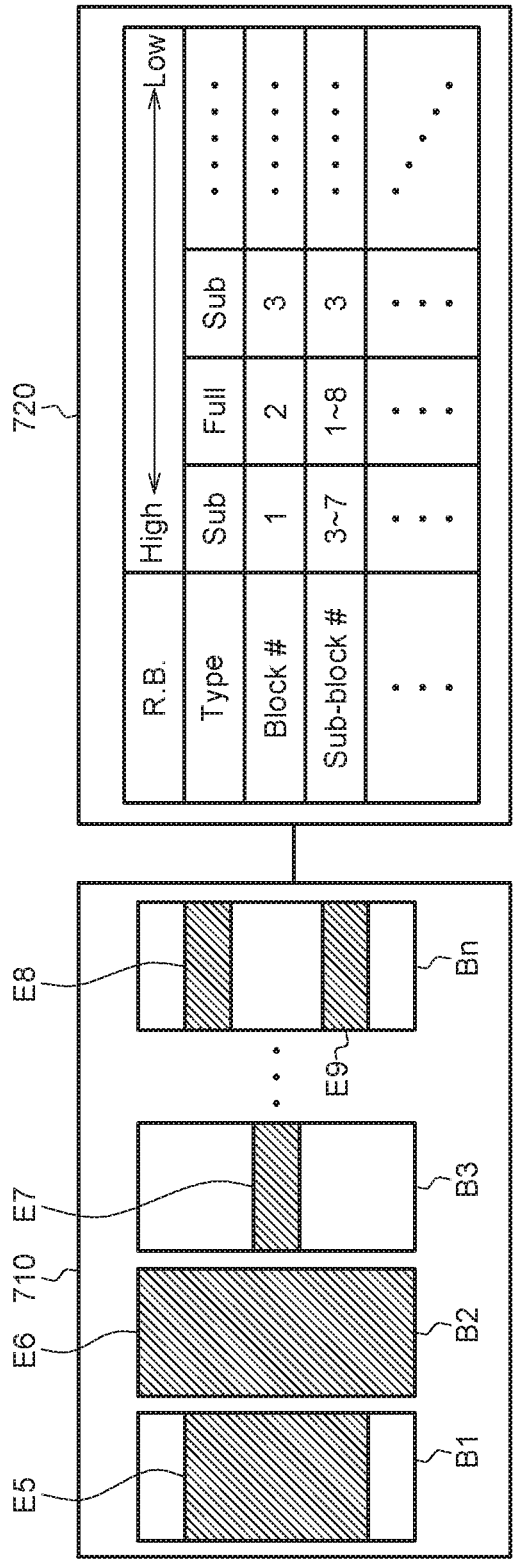
FIG. 7 shows a block diagram of a memory device according to the second embodiment of the present disclosure.

FIG. 7 shows a block diagram of a memory device according to the second embodiment of the present disclosure. The memory device 700 includes a memory array 710 and an erase controller 720. The memory array 710 includes a plurality of memory blocks B1-Bn. The erase controller 720 is electrically connected to the memory array 710. The erase controller 720 further stores a look-up table, and determines the order of the erase operation of each of the memory blocks, the type of the erase operation, and the sub-blocks to be erased. In this look-up table, the order of the erase operation of each of the memory blocks is sorted according to the value of the recycle benefit index. For example, at first, a sub-block erase operation is performed on the first memory block B1 having the highest value of recycle benefit index, and the sub-blocks 3-7 have the highest priority to be erased as shown in the erase region E5 in FIG. 7. And then, a full-block erase operation is performed on the second memory block B2 having the second highest value of recycle benefit index, and the sub-blocks 1-8 are being erased as shown in the erase region E6 in FIG. 7. Afterwards, a sub-block erase operation is performed on the third memory block B3, and the sub-block 3 is being erased as shown in the erase region E7 in FIG. 7. In an embodiment, the sub-block erase operation may be performed two times to erase two different regions (as shown in the erase regions E8 and E9 in FIG. 7) on the same memory block.

Figure 8:
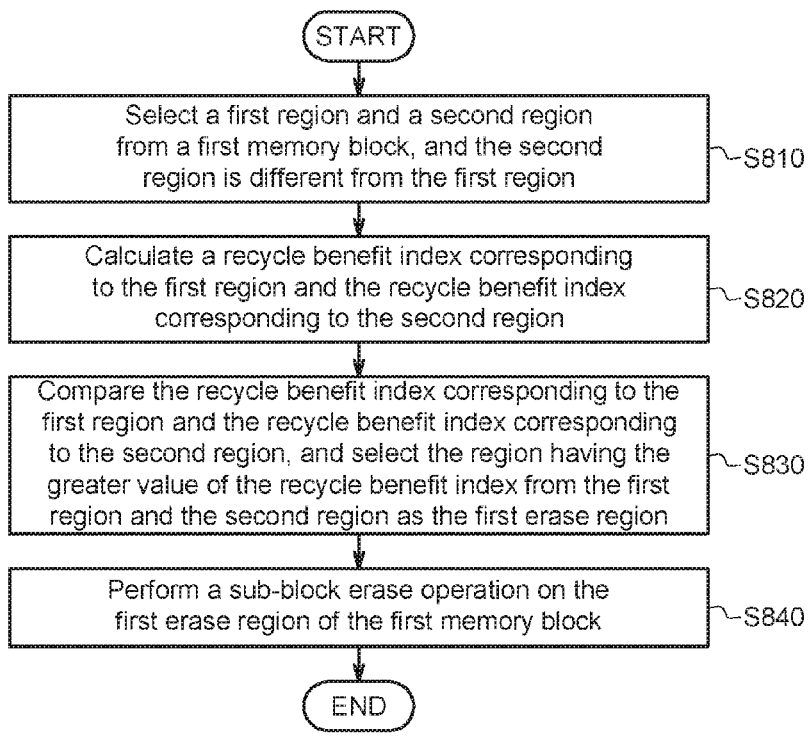
FIG. 8 shows a flow chart of an erasing method for a memory device according to the third embodiment of the present disclosure.

FIG. 8 shows a flow chart of an erasing method for a memory device according to the third embodiment of the present disclosure. The erasing method includes the following steps. Firstly, in step S810, a first region and a second region are selected from a first memory block, and the second region is different from the first region. And then in step S820, a recycle benefit index corresponding to the first region and the recycle benefit index corresponding to the second region are calculated. Afterwards, in step S830, the recycle benefit index corresponding to the first region is compared with the recycle benefit index corresponding to the second region, and the region having the greater value of the recycle benefit index is selected from the first region and the second region as the first erase region. Finally, in step S840, a sub-block erase operation is performed on the first erase region of the first memory block. In an embodiment, the data of the valid pages in the sub-block adjacent to the first erase region is moved to the other memory block before the sub-block erase operation is performed on the first erase region of the first memory block. And the erasing method stops.

Figure 9:
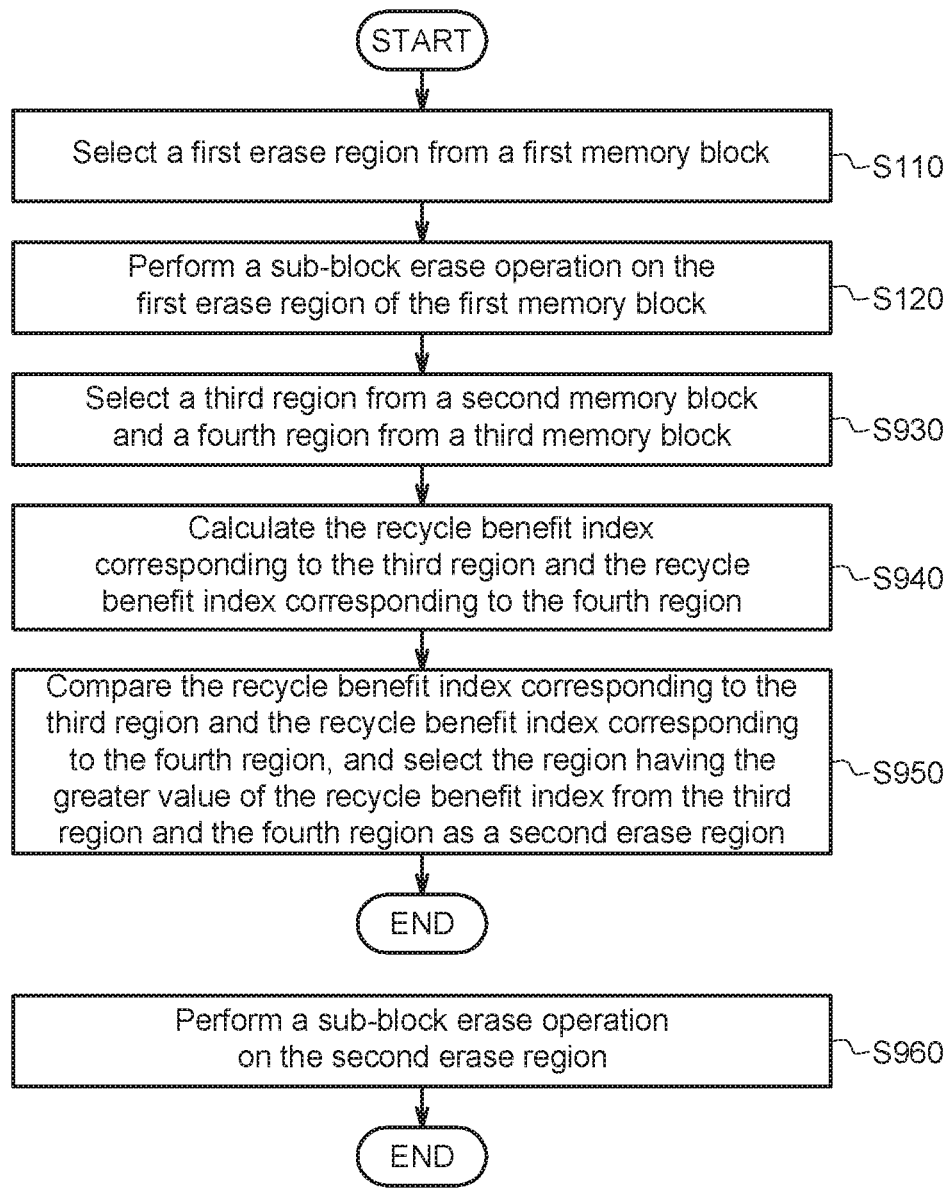
FIG. 9 shows a flow chart of an erasing method for a memory device according to the fourth embodiment of the present disclosure.

FIG. 9 shows a flow chart of an erasing method for a memory device according to the fourth embodiment of the present disclosure. The erasing method in FIG. 9 further includes the steps S930-S960. After the step S120 is performed, performing step S930, a third region is selected from a second memory block and a fourth region from a third memory block. Afterwards, in step S940, the recycle benefit index corresponding to the third region and the recycle benefit index corresponding to the fourth region are calculated. And then in step S950, the recycle benefit index corresponding to the third region is compared with the recycle benefit index corresponding to the fourth region, and the region having the greater value of the recycle benefit index is selected from the third region and the fourth region as a second erase region. And finally, in step S960, a sub-block erase operation is performed on the second erase region. And the erasing method stops.

According to the above embodiments, several memory devices and erasing methods are provided to perform a sub-block erase operation by selecting at least one sub-block from the memory block, and obtain more free space by calculating the recycle benefit index and finding the erase region. Moreover, the disturbance by the sub-block erase operation on the sub-block adjacent to the erase region may be avoided since the software-isolated sub-blocks is used in the present disclosure. And also, the cost of moving data of the sub-block adjacent to the erase region is considered without using a hardware-isolated layer adjacent to the erase region and therefore the extra cost of the hardware is not needed.

While the disclosure has been described by way of example and in terms of the exemplary embodiment(s), it is to be understood that the disclosure is not limited thereto. On the contrary, it is intended to cover various modifications and similar arrangements and procedures, and the scope of the appended claims therefore should be accorded the broadest interpretation so as to encompass all such modifications and similar arrangements and procedures.

What is claimed is:

1. An erasing method for a memory device comprising a plurality of memory blocks, wherein each of the memory blocks has n sub-blocks, wherein n is a positive integer, and the erasing method comprises:
   selecting a first erase region from a first memory block of the memory blocks, wherein the first erase region comprises at least one sub-block; and
   performing a sub-block erase operation on the first erase region of the first memory block;
   selecting a second erase region from the memory blocks, wherein the second erase region comprises at least one sub-block, and the second erase region is not overlapping the first erase region; and
   performing the sub-block erase operation on the second erase region;
   wherein each of the sub-blocks has a plurality of pages, each of the pages is a valid page or an invalid page.

2. The erasing method according to claim 1, further comprising:
   moving data of the valid pages in the sub-block adjacent to the first erase region to a second memory block of the memory blocks before performing the sub-block erase operation on the first erase region of the first memory block.

3. The erasing method according to claim 1, wherein the step of selecting the first erase region from the first memory block of the memory blocks comprises:
   selecting i consecutive sub-blocks as a first region from the n sub-blocks of the first memory block, wherein i is a positive integer, and $1 \leq i < n$;
   selecting j consecutive sub-blocks as a second region from the n sub-blocks of the first memory block, wherein j is a positive integer, and 1≤j<n, and the second region is different from the first region;

calculating a recycle benefit index corresponding to the first region and the recycle benefit index corresponding to the second region; and determining the first erase region according to the recycle benefit index;

wherein when the recycle benefit index corresponding to the first region is greater than the recycle benefit index corresponding to the second region, the first region is selected as the first erase region;

wherein when the recycle benefit index corresponding to the first region is smaller than the recycle benefit index corresponding to the second region, the second region is selected as the first erase region.

4. The erasing method according to claim 3, wherein each of the sub-blocks has a plurality of pages, each of the pages is a valid page or an invalid page, and the step of calculating the recycle benefit index comprises:

calculating a sum of a number of the valid pages in the sub-blocks of a region and the valid pages in the sub-block adjacent to the region as a valid page number;

calculating a sum of a number of the invalid pages in the sub-blocks of the region as an invalid page number; and calculating the recycle benefit index according to the valid page number and the invalid page number.

5. The erasing method according to claim 4, further comprising:

calculating the recycle benefit index corresponding to the first memory block according to a number of the valid pages in the n sub-blocks of the first memory block, and a number of the invalid pages in the n sub-blocks of the first memory block;

wherein when the recycle benefit index corresponding to the first memory block is greater than the recycle benefit index corresponding to the first region and also greater than the recycle benefit index corresponding to the second region, a full-block erase operation is performed on the first memory block.

6. The erasing method according to claim 1, wherein the step of selecting the first erase region from the first memory block of the memory blocks comprises:

generating a first region, a second region and a third region according to n sub-blocks of the first memory block, wherein the third region comprises the second region, the second region comprises the first region, the first region, the second region and the third region are different from each other, and the first region comprises at least one sub-block;

calculating a recycle benefit index corresponding to the first region, the recycle benefit index corresponding to the second region and the recycle benefit index corresponding to the third region; and selecting a region having a highest value of recycle benefit index from the first region, the second region and the third region as the first erase region.

7. The erasing method according to claim 1, wherein the step of selecting the first erase region from the first memory block of the memory blocks comprises:

generating k regions according to n sub-blocks of the first memory block, wherein k is a positive integer, and 1≤k<n, the k regions are different from each other, and each of the k regions comprises at least one sub-block;

calculating a recycle benefit index corresponding to each of the k regions; and selecting the region having a highest value of recycle benefit index from the k regions, the first region, the second region as the first erase region.

8. The erasing method according to claim 1, wherein the step of selecting the second erase region from the memory blocks comprises:

selecting a third region from a second memory block of the memory blocks, wherein the third region comprises at least one sub-block;

selecting a fourth region from a third memory block of the memory blocks, wherein the fourth region comprises at least one sub-block;

calculating a recycle benefit index corresponding to the third region, and the recycle benefit index corresponding to the fourth region; and determining the second erase region according to the recycle benefit index;

wherein when the recycle benefit index corresponding to the third region is greater than the recycle benefit index corresponding to the fourth region, the third region is selected as the second erase region;

wherein when the recycle benefit index corresponding to the third region is smaller than the recycle benefit index corresponding to the fourth region, the fourth region is selected as the second erase region.

9. The erasing method according to claim 1, wherein the second erase region is selected from the first memory block.

10. A memory device, comprising:

a memory array comprising a plurality of memory blocks, wherein each of the memory blocks has n sub-blocks, and n is a positive integer; and an erase controller electrically connected to the memory array, wherein the erase controller is configured to:

select a first erase region from a first memory block of the memory blocks, wherein the first erase region comprises at least one sub-block;

perform a sub-block erase operation on the first erase region of the first memory block, wherein the erase controller is further configured to:

select a second erase region from the memory blocks, wherein the second erase region comprises at least one sub-block, and the second erase region is not overlapping the first erase region; and perform the sub-block erase operation on the second erase region;

wherein each of the sub-blocks has a plurality of pages, each of the pages is a valid page or an invalid page.

11. The memory device according to claim 10, wherein the erase controller is further configured to:

move data of the valid pages in the sub-block adjacent to the first erase region to a second memory block of the memory blocks before performing the sub-block erase operation on the first erase region of the first memory block.

12. The memory device according to claim 10, wherein the erase controller is further configured to:

select i consecutive sub-blocks as a first region from the n sub-blocks of the first memory block, wherein i is a positive integer, and 1≤i<n;

select j consecutive sub-blocks as a second region from the n sub-blocks of the first memory block, wherein j is a positive integer, and 1≤j<n, and the second region is different from the first region;

calculate a recycle benefit index corresponding to the first region and the recycle benefit index corresponding to the second region; and determine the first erase region according to the recycle benefit index;

wherein when the recycle benefit index corresponding to the first region is greater than the recycle benefit index corresponding to the second region, the first region is selected as the first erase region;

wherein when the recycle benefit index corresponding to the first region is smaller than the recycle benefit index corresponding to the second region, the second region is selected as the first erase region.

13. The memory device according to claim 12, wherein each of the sub-blocks has a plurality of pages, each of the pages is a valid page or an invalid page, and the erase controller is further configured to:

calculate a sum of a number of the valid pages in the sub-blocks of a region and the valid pages in the sub-block adjacent to the region as a valid page number;

calculate a sum of a number of the invalid pages in the sub-blocks of the region as an invalid page number; and calculate the recycle benefit index according to the valid page number and the invalid page number.

14. The memory device according to claim 13, wherein the erase controller is further configured to:

calculate the recycle benefit index corresponding to the first memory block according to a number of the valid pages in the n sub-blocks of the first memory block, and a number of the invalid pages in the n sub-blocks of the first memory block;

wherein when the recycle benefit index corresponding to the first memory block is greater than the recycle benefit index corresponding to the first region and also greater than the recycle benefit index corresponding to the second region, a full-block erase operation is performed on the first memory block.

15. The memory device according to claim 10, wherein the erase controller is further configured to:

generate a first region, a second region and a third region according to n sub-blocks of the first memory block, wherein the third region comprises the second region, the second region comprises the first region, the first region, the second region and the third region are different from each other, and the first region comprises at least one sub-block;

calculate a recycle benefit index corresponding to the first region, the recycle benefit index corresponding to the second region and the recycle benefit index corresponding to the third region; and select a region having a highest value of recycle benefit index from the first region, the second region and the third region as the first erase region.

16. The memory device according to claim 10, wherein the erase controller is further configured to:

generate k regions according to n sub-blocks of the first memory block, wherein k is a positive integer, and 1≤k<n, the k regions are different from each other, and each of the k regions comprises at least one sub-block;

calculate a recycle benefit index corresponding to each of the k regions; and select the region having a highest value of recycle benefit index from the k regions, the first region, the second region as the first erase region.

17. The memory device according to claim 10, wherein the erase controller is further configured to:

select a third region from a second memory block of the memory blocks, wherein the third region comprises at least one sub-block;

select a fourth region from a third memory block of the memory blocks, wherein the fourth region comprises at least one sub-block;

calculate a recycle benefit index corresponding to the third region, and the recycle benefit index corresponding to the fourth region; and determine the second erase region according to the recycle benefit index;

wherein when the recycle benefit index corresponding to the third region is greater than the recycle benefit index corresponding to the fourth region, the third region is selected as the second erase region;

wherein when the recycle benefit index corresponding to the third region is smaller than the recycle benefit index corresponding to the fourth region, the fourth region is selected as the second erase region.

18. The memory device according to claim 10, wherein the erase controller is further configured to select the second erase region from the first memory block.

* * * * *